United States Patent
Fukui

(10) Patent No.: US 6,209,119 B1
(45) Date of Patent: *Mar. 27, 2001

(54) APPARATUS AND METHOD FOR SYNTHESIZING MODULE

(75) Inventor: Masahiro Fukui, Osaka (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/057,477

(22) Filed: Apr. 9, 1998

(30) Foreign Application Priority Data

Apr. 10, 1997 (JP) .................................... 9-092173

(51) Int. Cl.$^7$ ..................................................... G06F 17/50
(52) U.S. Cl. .................................................................. 716/2
(58) Field of Search ............................ 395/500.01; 716/9

(56) References Cited

U.S. PATENT DOCUMENTS 5,654,898 * 8/1997 Roetcisoender ................. 395/500.01
5,973,376 * 10/1999 Rostoker .......................... 395/500.6

FOREIGN PATENT DOCUMENTS 63-250152 10/1988 (JP) .
03104138 5/1991 (JP) .
04167446 6/1992 (JP) .
08050600 2/1996 (JP) .

OTHER PUBLICATIONS

D. F. Wong and C. L. Liu—A New Algorithm For Floorplan Design—1986.
L. Stockmeyer, "Optimal Orientations of Cells in Slicing Floorplan Designs", Information and Control 57, by Academic Press, Inc., pp. 91–101.
J.P. Fishburn, et al., 'Tilos: A Posynomial Programming Approach to Transistor Sizing, Proc. of IEEE, pp. 326–328, 1985.
J. Cong, et al., 'General Models and Algorithms For Over–The–Cell Routing in Standard Cell Design, Proc. of 27$^{th}$ ACM/IEEE Design Automation Conference, pp. 709–715, 1990.
S. Sapatnekar, et al., "Analysis/Optimization of Performance and Noise in Deep Submicron Designs", pp. 1 and 3, Feb. 10, 1998.

* cited by examiner

*Primary Examiner*—Matthew Smith
*Assistant Examiner*—Thuan Do
(74) *Attorney, Agent, or Firm*—McDermott, Will & Emery

(57) ABSTRACT

A functional-level processing unit converts a data path diagram into logic circuit data. A logic-level processing unit specifies cells in a data path circuit based on the logic circuit data. A synthesis processing unit uses geometrical functions of the cells which have been parameterized by delays thereof, thereby synthesizing a layout module for the data path circuit based on the logic circuit data used to specify the cells and on a floorplan for the module. The synthesis processing unit also obtains a geometrical function parameterized by delay for the layout module. By synthesizing a layout module using the geometrical functions of the cells, which have been parameterized by the delays thereof, the geometry of the layout module can be optimized with high accuracy. In addition, by generating a geometrical function for the layout module, it becomes easier to establish a linkage to the upper process of design.

7 Claims, 16 Drawing Sheets

Fig. 3

| time slot | Function | Area | Delay | Power |
|---|---|---|---|---|
| – | total | 30X50 | 50 | 25 |
| 0 | F1 | 30X50 | 18 | 5 |
| * 1 | F2 | 30X10 | 10  50 | 3 |
|  | F3 | 30X20 | 40 50 | 8 |
| 2 | F4 | 30X5 | 20 | 5 |

Fig. 6

ADDER

| adder | | | |
|---|---|---|---|
| candidate | Area | Delay | Power |
| A (CAL) | 3X10 10X3 | 18 ▪ | ▪ 5 |
| B (CAL) | 5X8 8X5 | 20 ▬ | ▬ 5 |
| C (RC) | 8X8 3X10 | 10 ▪ | ▪ 3 |

Fig. 7

INVERTER

| inverter | | | |
|---|---|---|---|
| candidate | type | circuit | condition |
| A | standard | | |
| B | high performance | | |
| C | path | N/A | |

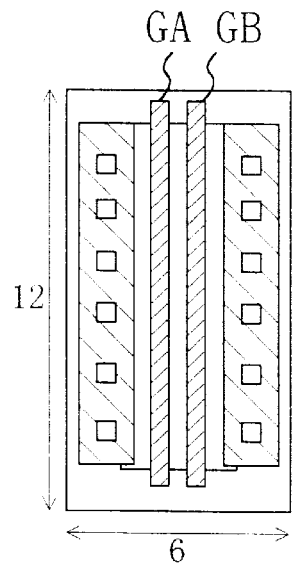
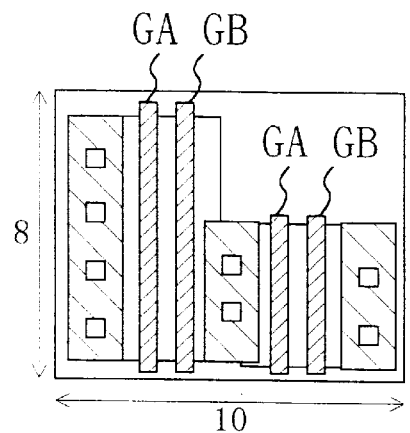
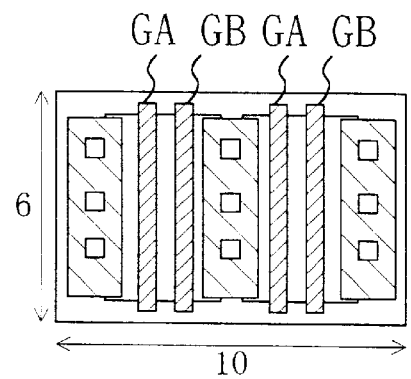
Fig. 10 (a)   Fig. 10 (b)   Fig. 10 (c)
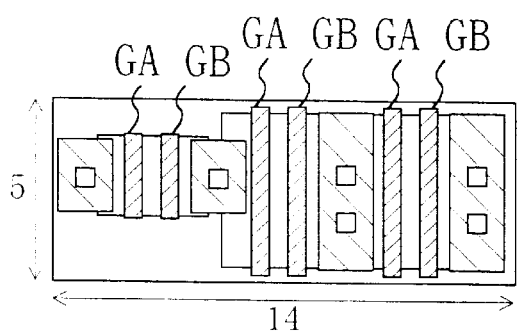
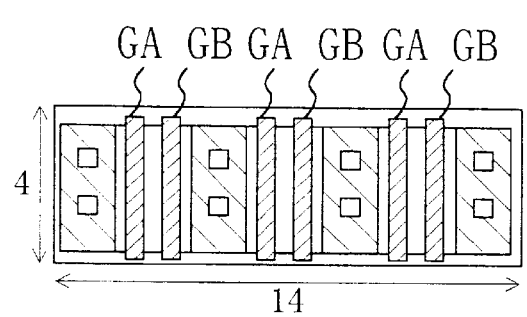
Fig. 10 (d)   Fig. 10 (e)

APPARATUS AND METHOD FOR SYNTHESIZING MODULE

BACKGROUND OF THE INVENTION

The present invention relates to the technology for synthesizing a layout module for a data path circuit used in an LSI including a CMOS.

In recent years, a degree of integration and a clock frequency of an LSI have been increased continuously. According to current estimates the number of transistors per unit area of 1 $cm^2$ in an LSI will reach 18 millions in 2003, while the clock frequency used therein will be as high as 500 MHz (ASP-DAC '98, Tutorial 3, "Analysis/Optimization of Performance and Noise in Deep Submicron Designs," Tuesday, Feb. 10, 1998).

Under such circumstances, LSI manufacturing has entered a deep submicron era and LSI design has become increasingly complicated. For example, since the wiring spacing has been minimized to approximately 0.1 $\mu$m, delay and power consumption are more dependent on wiring load than on gate capacitance. Thus, it has become extremely difficult to evaluate the delay, power consumption, and clock skew of an LSI in the upper process of design (functional level and RTL level). The minimized wiring spacing also requires a wiring model, used for estimating a wiring delay, to reflect the influence of the coupling capacitance of wires. However, it is substantially impossible to estimate the coupling capacitance of wires in the upper process of design.

Consequently, the capability to correct the result of the upper process of design in the lower process of design (logic level and transistor level) becomes extremely important. By establishing a close linkage between the evaluating capability in the upper process of design and the correcting capability in the lower process of design, iteration in the LSI design can be lessened, which reduces design cost and implements higher-quality LSI design.

To establish a close linkage between the upper and lower processes of design, it is necessary to provide, from the lower side of design, accurate data about the performance and area of a module required by the upper side of design in a shorter period of time. In short, a module synthesizing apparatus used in the lower process of design should have a capability of instantaneously estimating the results of syntheses with respect to a plurality of conditions in order that a tool for synthesis used in the upper process of design can explore a design space for optimizing module allocation and binding. However, the conventional module synthesizing apparatus does not have such a capability and merely synthesizes a layout module with respect to a single condition. If the performance and area of a module are to be estimated with respect to a plurality of conditions, therefore, the conventional module synthesizing apparatus has no other alternative than to actually synthesize the module with respect to each of the conditions, which wastes a great deal of processing time.

In addition, since a cell used in the conventional module synthesizing apparatus has substantially no geometrical flexibility, a dead area is likely to arise when a cell having an optimum driving ability is selected. As a result, the geometry of a layout module cannot be optimized with accuracy.

SUMMARY OF THE INVENTION

It is therefore an objective of the present invention to provide an apparatus and method for synthesizing a module for a data path circuit, which can optimize the geometry of a layout module with high accuracy and can easily establish a close linkage to the upper process of design.

Specifically, the present invention provides a module synthesizing apparatus for synthesizing a layout module for a data path circuit, including: a logic-level processing unit for specifying cells in the data path circuit based on logic circuit data representing the data path circuit on a logic level; a cell-property estimating unit for obtaining a geometrical function parameterized by delay for a cell provided with a circuit configuration on a transistor level; and a synthesis processing unit for setting circuit configurations on the transistor level for the respective cells specified by said logic-level processing unit, supplying the set circuit configurations on the transistor level to the cell-property estimating unit, and then synthesizing a layout module based on geometrical functions of the respective cells, which have been parameterized by delays and have been obtained by the cell-property estimating unit.

According to the present invention, a geometrical function parameterized by delay can be generated for each of the cells in the data path circuit, which have been specified by the logic-level processing unit, based on the transistor-level circuit configuration supplied from the synthesis processing unit. As a result, a cell in the data path circuit has higher geometrical flexibility as compared with a conventional apparatus. Since the synthesis processing unit synthesizes a layout module by using the cell geometrical function parameterized by delay, a dead area between cells can be reduced and the geometry of the layout module can be optimized with higher accuracy as compared with a conventional apparatus.

Preferably, the synthesis processing unit synthesizes the layout module and/or obtains a geometrical function parameterized by delay for the layout module.

This enables the synthesis processing unit to obtain a geometrical function parameterized by delay for the layout module, so that a linkage to the upper process of design is established more easily as compared with a conventional apparatus.

The present invention also provides a module synthesizing apparatus for synthesizing a layout module for a data path circuit, including: a data-path-diagram display correcting unit for displaying a data path diagram and for correcting an arrangement of registers in the data path diagram based on an instruction given from the outside of the module synthesizing apparatus; a function-property estimating unit for estimating a delay in each of functions of the data path diagram; and a function-property display unit for displaying the delay in each said function estimated by the function-property estimating unit.

According to the present invention, a user can interactively correct the arrangement of registers in the data path diagram by using the data-path-diagram display correcting unit, while monitoring the delay in the function displayed by the function-property display unit. This facilitates the correction of imbalanced processing times in the individual time slots and allows the synthesis of a module more excellent in delay performance as compared with a conventional apparatus.

The present invention also provides a module synthesizing method for synthesizing a layout module for a data path circuit, including the steps of: converting a data path diagram into logic circuit data representing the data path circuit on a logic level by allocating a logic circuit to each function; specifying cells in the data path circuit based on the logic circuit data; obtaining a geometrical function parameterized by delay for each of the specified cells; and synthesizing a layout module based on a floorplan for the layout module and the geometrical functions of the cells which have been parameterized by delays.

Preferably, the module synthesizing method further includes a step of synthesizing the layout module and/or obtaining a geometrical function parameterized by delay for the layout module.

BRIEF DESCRIPTION OF THE DRAWINGS

FIG. 2 shows an example of a data path diagram displayed by a data-path-diagram display correcting unit 11a.

FIG. 3 shows an example, displayed by a function-property display unit 21, of the properties of each function in the data path diagram shown in FIG. 2.

FIG. 6 shows an example of data from a logic circuit library 51 being displayed on a screen, which indicates the area, delay, and power consumption of an adder.

FIG. 7 shows an example of data from a transistor circuit library 52 being displayed on a screen, which indicates transistor circuits for an inverter.

FIGS. 10(a) to 10(e) show variations in the geometry of a transistor group G1 shown in FIG. 9 when it is folded in different shapes.

FIG. 13(a) shows a circuit included In a 1-bit netlist; and FIG. 13(b) shows an example of the allocation of circuit components of the circuit shown in FIG. 13(a) to individual cells.

FIG. 16(a) shows a geometrical function for a cell A; FIG. 16(b) shows a geometrical function for a cell B; and FIG. 16(c) shows a geometrical function for a rectangle surrounding the cells A and B vertically adjacent to each other.

DETAILED DESCRIPTION OF THE INVENTION

Figure 1:
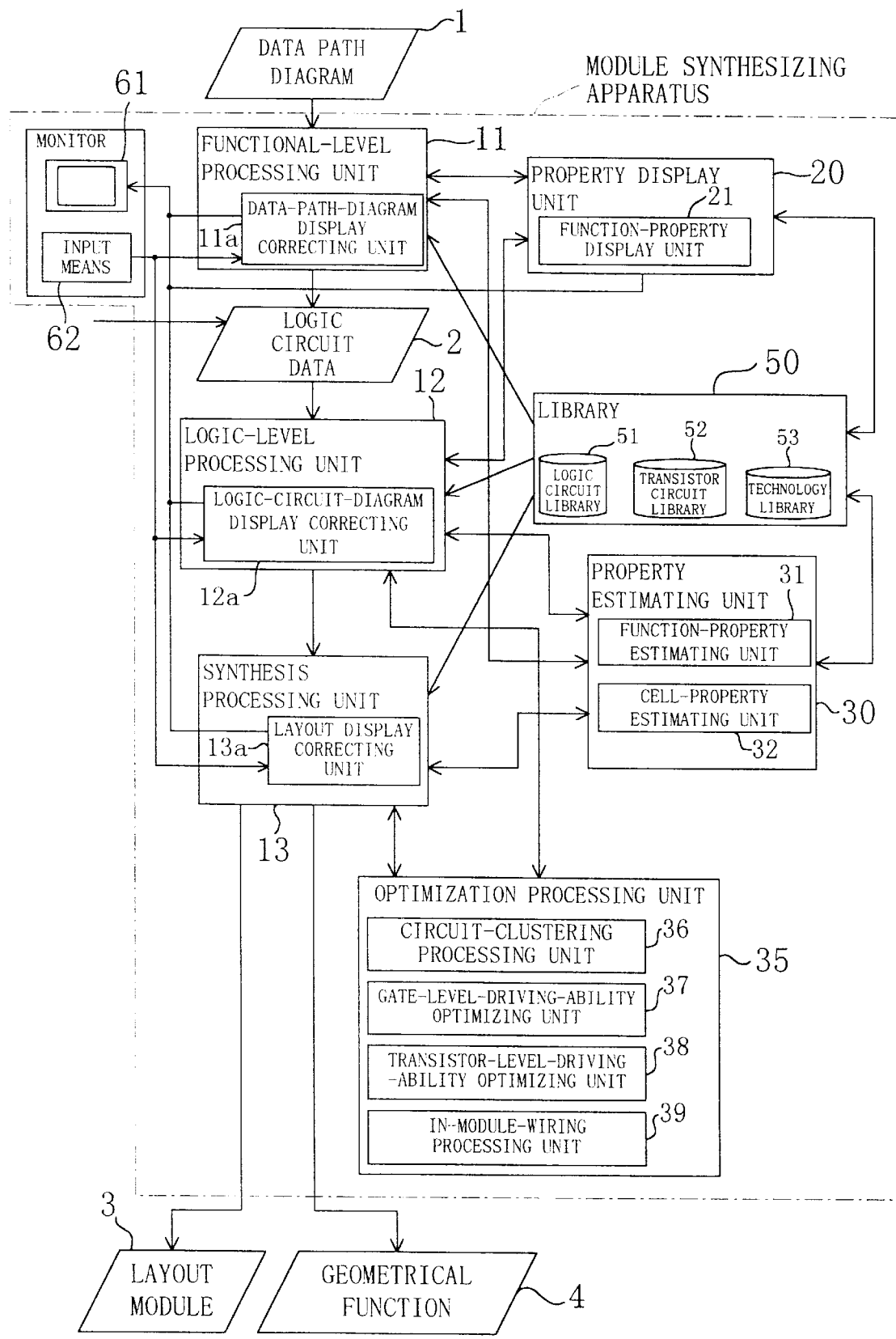
FIG. 1 is a block diagram showing the structure of a module synthesizing apparatus according to an embodiment of the present invention.

Referring to the drawings, an embodiment of the present invention will be described.

FIG. 1 is a block diagram showing the structure of a module synthesizing apparatus according to the present embodiment. The module synthesizing apparatus shown in FIG. 1 includes: a functional-level processing unit 11 for converting a data path diagram 1 into logic circuit data 2; a logic-level processing unit 12 for specifying cells in a data path circuit based on the logic circuit data 2 input from the functional-level processing unit 11 or from the outside; a synthesis processing unit 13 for synthesizing a layout module 3 for the data path circuit based on the logic circuit data used to specify the cells; a property display unit 20 for displaying the properties of a function, cell, and the like; a property estimating unit 30 for estimating the properties of a function, cell, or the like; an optimization processing unit 35 for performing various processes to optimize the synthesized layout module; and a library 50. The module synthesizing apparatus according to the present embodiment further includes a monitor 61 and input means 62 such as a keyboard or a mouse.

The functional-level processing unit 11 has a data-path-diagram display correcting unit 11a for displaying the data path diagram 1 on the monitor 61 and correcting the arrangement of registers (by shifting, inserting, or deleting the registers) based on an externally given instruction via the input means 62. The logic-level processing unit 12 has a logic-circuit-diagram display correcting unit 12a for displaying the logic circuit data 2 on the monitor 61 and correcting the extent of each cell in the logic circuit data 2 based on an externally given instruction via the input means 62. The synthesis processing unit 13 has a layout display correcting unit 13a for displaying, on the monitor 61, a floorplan for a module externally input via the input means 62 and correcting the displayed floorplan based on an externally input instruction via the input means 62.

The property display unit 20 has a function-property display unit 21 for reading and displaying the delay and other properties of each function in the data path diagram 1 from the library 50. The property estimating unit 30 includes: a function-property estimating unit 31 for estimating the delay and other properties of each function in the data path diagram 1; and a cell-property estimating unit 32 for estimating the area and other properties of a cell.

The optimization processing unit 35 includes: a circuit-clustering processing unit 36; a gate-level-driving-ability optimizing unit 37; a transistor-level-driving-ability optimizing unit 38; and an in-module-wiring processing unit 39. The library 50 includes: a logic circuit library 51; a transistor circuit library 52; and a technology library 53.

The module synthesizing apparatus according to the present embodiment outputs, as module estimation data, not only a layout module 3 that is a result of synthesizing a module but also a geometrical function 4 parameterized by delay for the layout module. Alternatively, the module synthesizing apparatus outputs either one of the layout module 3 and the geometrical function 4 as the module estimation data.

Figure 2:
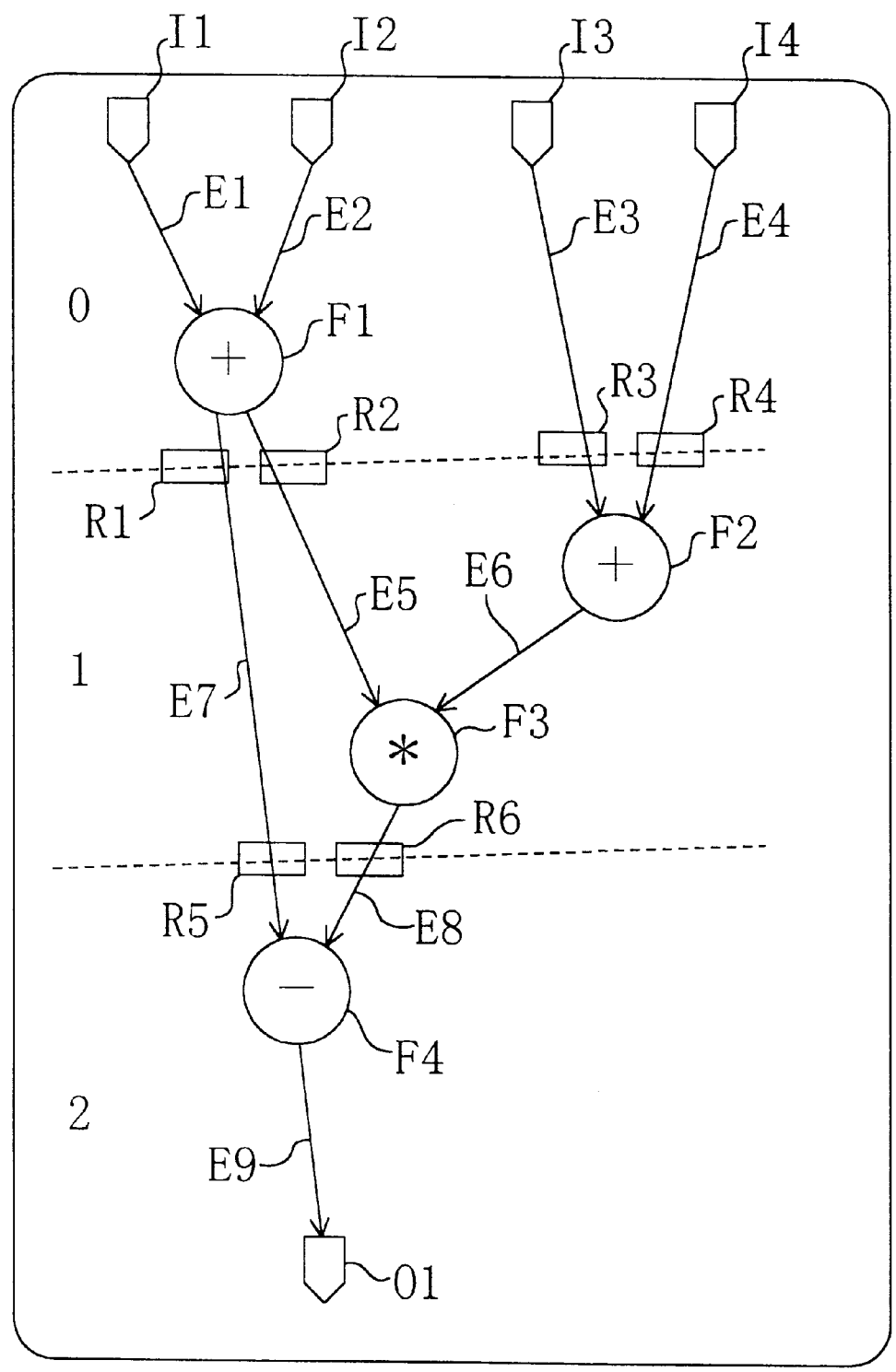

FIG. 2 shows an example of the data path diagram 1 displayed on the monitor 61 by the data-path-diagram display correcting unit 11a. In FIG. 2, I1 to I4 denote input terminals, F1 to F4 denote functions, E1 to E9 denote data flows, R1 to R6 denote registers and O1 denotes an output terminal. The data path diagram 1 used in the module synthesizing apparatus according to the present embodiment allows the arrangement of the registers to be corrected and module binding (selection of actual circuits allocated to the foregoing functions) to be changed. However, resource sharing is not permitted.

In the module synthesizing apparatus according to the present embodiment, a user can correct the arrangement of the registers in the data path diagram 1 by performing an interactive operation.

A delay time of each function and an insertion position of a register influence a clock frequency of an LSI. Generally, resource sharing and module binding are performed in the upper process of design, and the insertion position of a register is also determined. The module synthesizing apparatus synthesizes a layout module for the data path diagram for which these conditions have been specified in the upper process of design. In the case where process technology has changed, however, it is required to reuse and re-optimize the layout module by using full use of data obtained in the upper process of design. In that case, shifting of the registers in the process of synthesizing a module is preferably permitted as long as operation specifications determined in the upper process of design are not changed. If the module synthesizing apparatus according to the present embodiment is used, an insertion position of a register relating to pipeline processing can be determined interactively, which allows for the reuse and re-optimization of the layout module.

Thus, the module synthesizing apparatus according to the present embodiment is characterized by the capability to correct the arrangement of the registers in the data path diagram through interactive operation in the process of synthesizing a module.

FIG. 3 shows an example, corresponding to the data path diagram shown in FIG. 2, of data displayed on the monitor 61 by the function-property display unit 21. As shown in FIG. 3, the function-property display unit 21 collectively displays the delay and other properties of each function within each time slot.

A delay of each function is calculated by the function-property estimating unit 31 and stored in the logic circuit library 51. The area and power consumption of each function are also stored in the logic circuit library 51. The function-property display unit 21 reads the delay, area, and power consumption of each function from the logic circuit library 51 and displays them on the monitor 61, as shown in FIG. 3.

In the data path diagram shown in FIG. 2, functions F2 (addition) and F3 (multiplication) are performed sequentially in the time slot 1. In this case, a sum (50) of the delays (10) and (40) in the functions F2 and F3 corresponds to a processing time in the time slot 1. In order to display a processing time of each time slot as well as the delay of each function, the function-property display unit 21 displays the delay of each function as a solid strip and the processing time of each time slot as a hatched strip, as shown in FIG. 3.

An arithmetic operation performed in each time slot should be processed within one clock period. Consequently, a maximum processing time per time slot is a critical factor in determining the clock period. In FIG. 3, the processing time (50) in the time slot 1 corresponds to the maximum processing time. Therefore,.a clock period can be reduced by increasing the processing speed of the functions assigned to the time slot 1. In order to inform a user of the fact, "*" is displayed in the time slot in which the processing time becomes maximum.

A function assigned to a time slot, other than the time slot having the maximum processing time, may be replaced by another function having a longer delay until the processing time of the former time slot reaches the maximum processing time per time slot. In order to inform a user of the fact, the maximum processing time per time slot, i.e., a clock period, is displayed as a blank frame in each time slot, as shown in FIG. 3. The portion inside the blank frame other than the black strip portion indicates allowance for delay, which is called slack.

Since a conventional module synthesizing apparatus does not have the capability of correcting the arrangement of registers in a data path diagram even when processing times in the respective time slots are imbalanced, the apparatus cannot correct such imbalanced processing times. Thus, the apparatus cannot synthesize a module excellent in delay performance. Since an insertion position of a register is fixed for pipeline processing, the arrangement of the registers cannot either be corrected in order to obtain a module with improved performance. Furthermore, it is difficult for a user to recognize the properties of each function and optimize the performance of the module. In short, the conventional module synthesizing apparatus does not have the capability of displaying critical portions in terms of the properties of each function and of the performance of the module but provides only property data for the result of synthesis. As a consequence, the optimization of module performance necessitates complicated manual operations, which elongates a time required to develop the module.

By contrast, the module synthesizing apparatus according to the present embodiment allows a user to correct the arrangement of the registers in the data path diagram, while monitoring data displayed on the screen by the function-property display unit 21, as shown in FIG. 3. This corrects imbalanced processing times in the individual time slots and thereby enables the synthesis of a module having superior delay performance to that of a conventional synthesizing apparatus.

Figure 4:
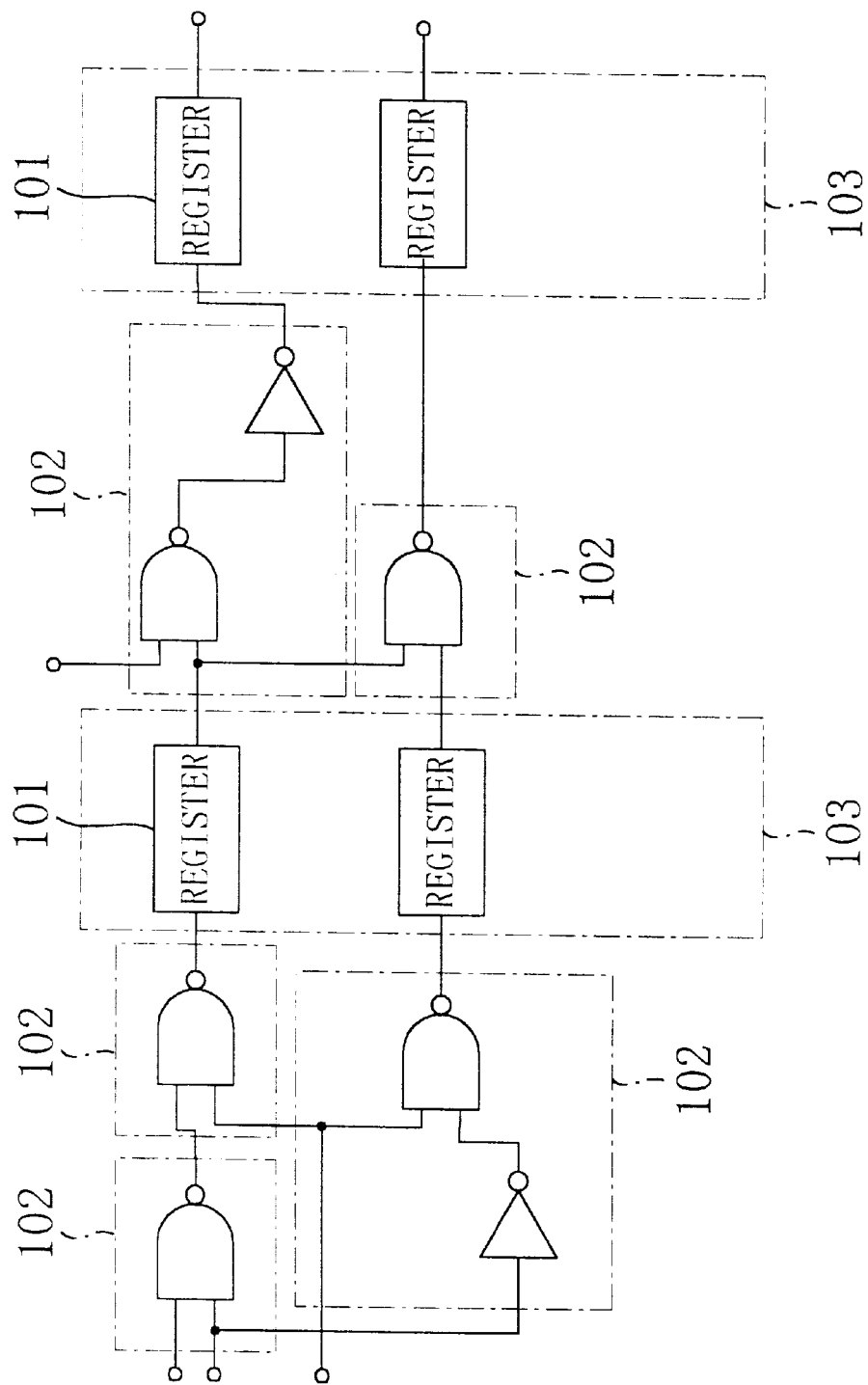
FIG. 4 shows an example, displayed by a logic-circuit-diagram display correcting unit 12a, of a logic circuit representing a data path circuit.

FIG. 4 shows an example of logic circuits representing a data path circuit, which is displayed on the monitor 61 by the logic-circuit-diagram display correcting unit 12a. In FIG. 4, 101 denotes a register, 102 denotes a cell and 103 denotes a column of registers. The cell 102 can be obtained by classifying one or more logic circuits into a group.

In the present specification, a cell is defined as a set of circuits having one whole function. The specific implementation of a cell differs with design phases. Specifically, a cell is sequentially represented by functional data at an initial stage of design, by a set of logic circuits when logic design is complete, by a transistor-level circuit when circuit design is complete, and by a layout diagram when layout design is complete. A cell may also be called a function cell or a functional cell. A cell for performing an arithmetic operation is called an operation cell. A cell for storing data is called a storage cell.

Since a cell corresponds to the function in the upper process of design, the functional-level processing unit 11 places a column of operation cells and a column of storage cells (column of register cells) along the flow of data and in accordance with the data path diagram 1, reads logic circuits corresponding to individual functions from the logic circuit library 51 and allocates the read logic circuits to the individual functions, thereby converting the data path diagram 1 into the logic circuit data 2. The logic-circuit-diagram display correcting unit 12a displays on the monitor 61 the logic circuit data 2 input to the logic-level processing unit 12 in the form of a logic circuit diagram and corrects the extent of each cell in the logic circuit diagram based on an externally given instruction via the input means 62.

Thus, the module synthesizing apparatus according to the present embodiment is capable of changing the set of logic circuits included in the cell and interchanging the locations of the columns of cells through user's interactive operation.

Figure 5:
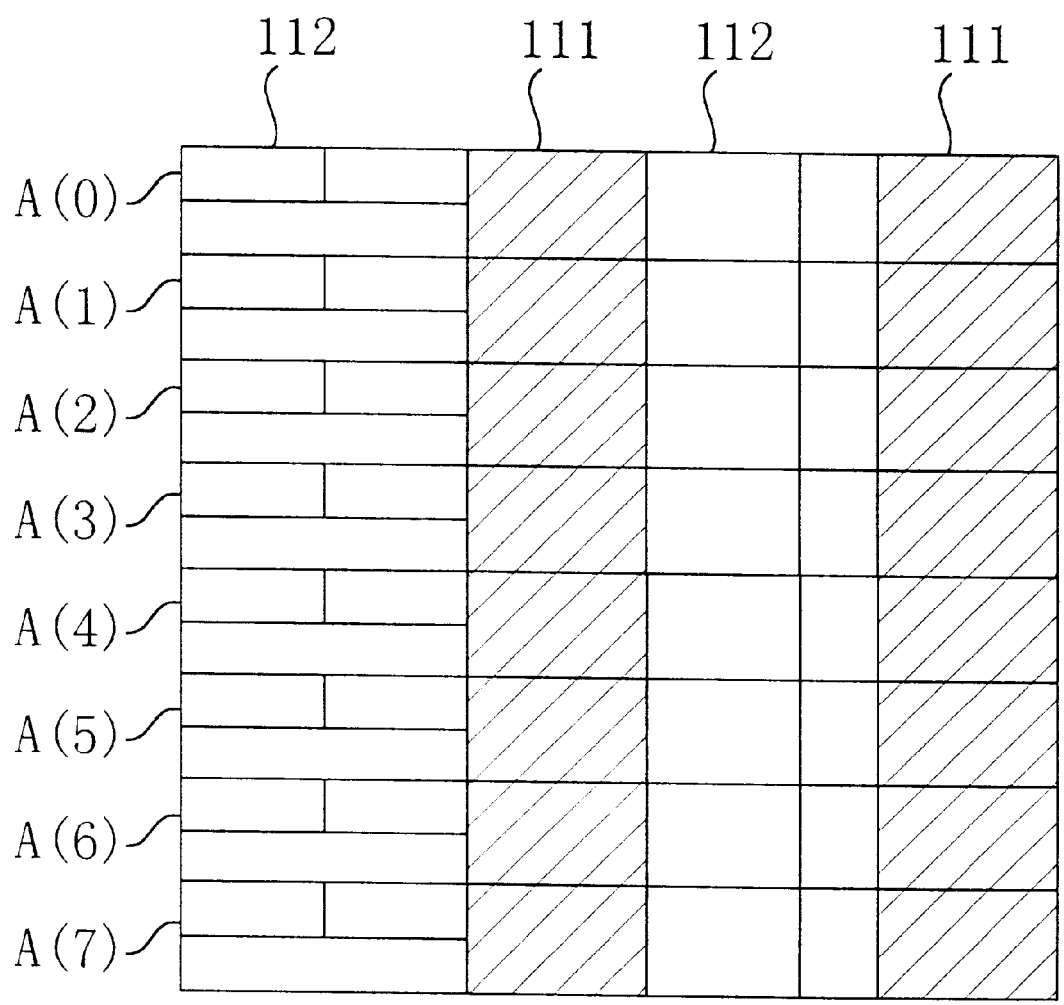
FIG. 5 shows an example, displayed by a layout display correcting unit 13, of a floorplan for a layout module.

FIG. 5 shows an example of a floorplan for a layout module displayed on the screen of the monitor 61 by the layout display correcting unit 13a. In FIG. 5, 111 denotes a column of register cells and 112 denotes a column of operation cells. The synthesis processing unit 13 produces the floorplan for the layout module based on cell interconnection data determined by the logic-level processing unit 12, as shown in FIG. 4, and in accordance with an externally given instruction via the input means 62. As the floorplan for the layout module, the stacking of cells in two layers or the like can be selected through user's specification or automatic optimization processing.

Data from the library 50 is also displayed on the screen by the property display unit 20.

FIG. 6 shows an example of data displayed on the screen from the logic circuit library 51, which indicates the area, delay, and power consumption of an adder. The logic circuit library 51 stores data for each function such as an adder in the form of parameterized area, delay, and power consumption. The data is calculated by the function-property estimating unit 31. In FIG. 6, the hatched portion indicates a circuit currently selected for the function (adder). A user examines the properties of the functions as shown in FIG. 3, finds out a function for which delay should be improved, and selects an optimum circuit for the function based on the data as shown in FIG. 6, thereby performing optimization interactively.

FIG. 7 shows an example of data displayed on the screen from the transistor circuit library 52, which indicates transistor circuits for an inverter. The transistor circuit library 52 stores data about the transistor circuit corresponding to each logic circuit. In FIG. 7, the hatched portion indicates a transistor circuit currently selected for the logic circuit (inverter).

The technology library 53 stores design rules, constrains, circuit parameters, and the like for the currently used technology, which are mainly referenced by the optimization processing unit 35.

Figure 8:
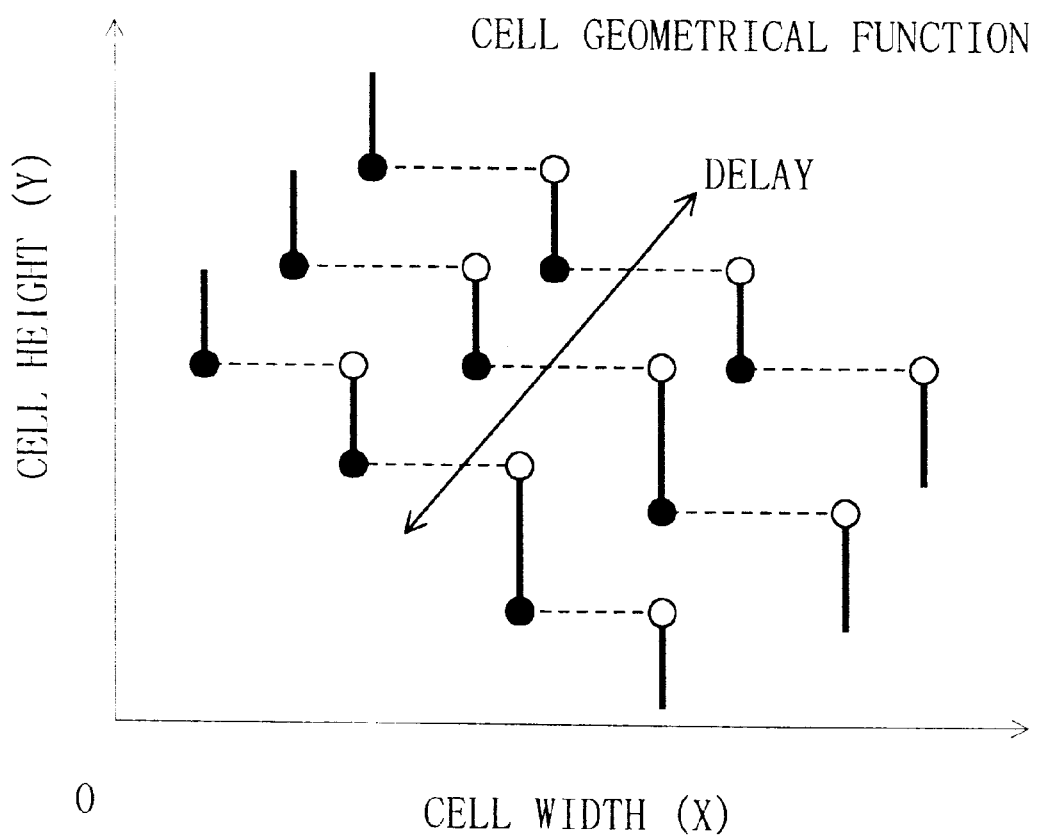
FIG. 8 is a graph showing an example of a cell geometrical function parameterized by delay obtained by a cell-property estimating unit 32.

The cell-property estimating unit 32 obtains, for each of the cells provided with a transistor-level circuit configuration, a geometrical function parameterized by delay. FIG. 8 is a graph showing, by way of example, cell geometrical functions parameterized by delay. As shown in FIG. 8, the cell geometrical functions parameterized by delay are a set of cell geometrical functions individually obtained in response to a plurality of delay requirements. Each geometrical function represents the relationship between the height (Y) and width (X) of a cell satisfying one of the delay requirements, i.e., the geometrical flexibility of the cell. The cell geometrical functions parameterized by delay are used, when the synthesis processing unit 13 synthesizes a module, to minimize a dead area between the cells in the module and thereby increase the degree of integration of the module.

When each of the cells is provided with a transistor-level circuit configuration, the cell-property estimating unit 32 sets a plurality of delay requirements for the cell, performs Estimation of Cell Geometrical Function as follows with respect to each of the delay requirements, and thereby obtains the cell geometrical functions parameterized by delay as shown in FIG. 8. In this case, it is assumed that upper and lower limits to a cell height are supplied to the cell-property estimating unit 32.

Estimation of Cell Geometrical Function (Step E1) A delay requirement is set for each of the cells.

(Step E2) A gate width of each transistor is optimized (by appropriately using a method of optimizing a transistor size disclosed, for example, in "TILOS: A Posynomial Programming Approach to Transistor Sizing" (Fishburn et. al., IC-CAD85, pp. 326–328, 1985).

(Step E3) Of the transistors constituting the cell, serially connected transistors are classified as a group sharing a diffusion region.

Figure 9:
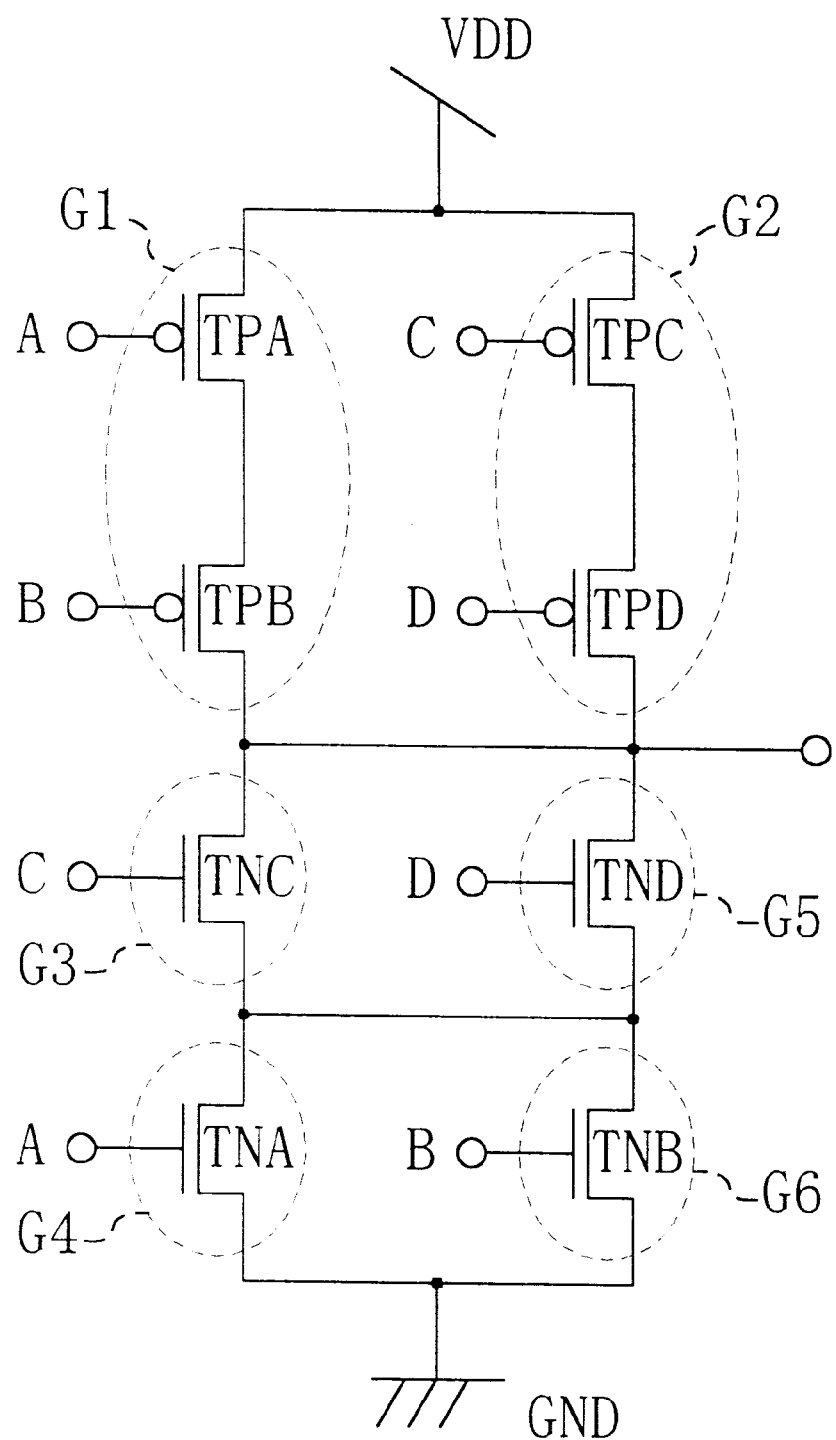
FIG. 9 shows an example of transistor circuits constituting a cell.

FIG. 9 shows an example of the transistors constituting the cell. In FIG. 9, VDD denotes a power supply, GND denotes a ground, TPA to TPD denote P-type transistors, and TNA to TND denote N-type transistors. The P-type transistors TPA and TPB are connected in series, and the P-type transistors TPC and TPD are also connected in series. A pair of serially connected transistors is classified as a group sharing a diffusion region, whereby the transistor groups G1 to G6 are defined.

(Step E4) Candidates for the potential cell height are determined based on the structural definition of the cell.

It is assumed here that the cell is a CMOS cell in which a P-channel region and an N-channel region are vertically stacked in layers. It is also assumed that the upper and lower limits to the heights of the P-channel and N-channel regions are specified. Of the transistor groups, a transistor belonging to a transistor group in which the gate width thereof is larger than the lower limit value to the height of the channel region is assumed to be folded and the geometrical function when the transistor is folded is obtained.

It is assumed that, in the transistor circuit shown in FIG. 9, the gate width of the transistor group G1 in the P-channel region is limited to 12 and the height of the P-channel region is limited to the range of 4 to 8.

FIG. 10 show variations in the geometry of the transistor group G1 in accordance with different forms of folding. As shown in FIGS. 10(a) to 10(e), the rectangle enclosing the transistor group G1 varies in geometry as the number of folded portions is changed. For example, a geometry having no folded portion as shown in FIG. 10(a) has a width of 6 and a height of 12. A geometry having one folded portion as shown in FIG. 10(b) has a width of 10 and a height of 8, while a geometry also having one folded portion as shown in FIG. 10(c) has a width of 10 and a height of 6. A geometry having two folded portions as shown in FIG. 10(d) has a width of 14 and a height of 5, while a geometry also having two folded portions as shown in FIG. 10(e) has a width of 14 and a height of 4.

Figure 11:
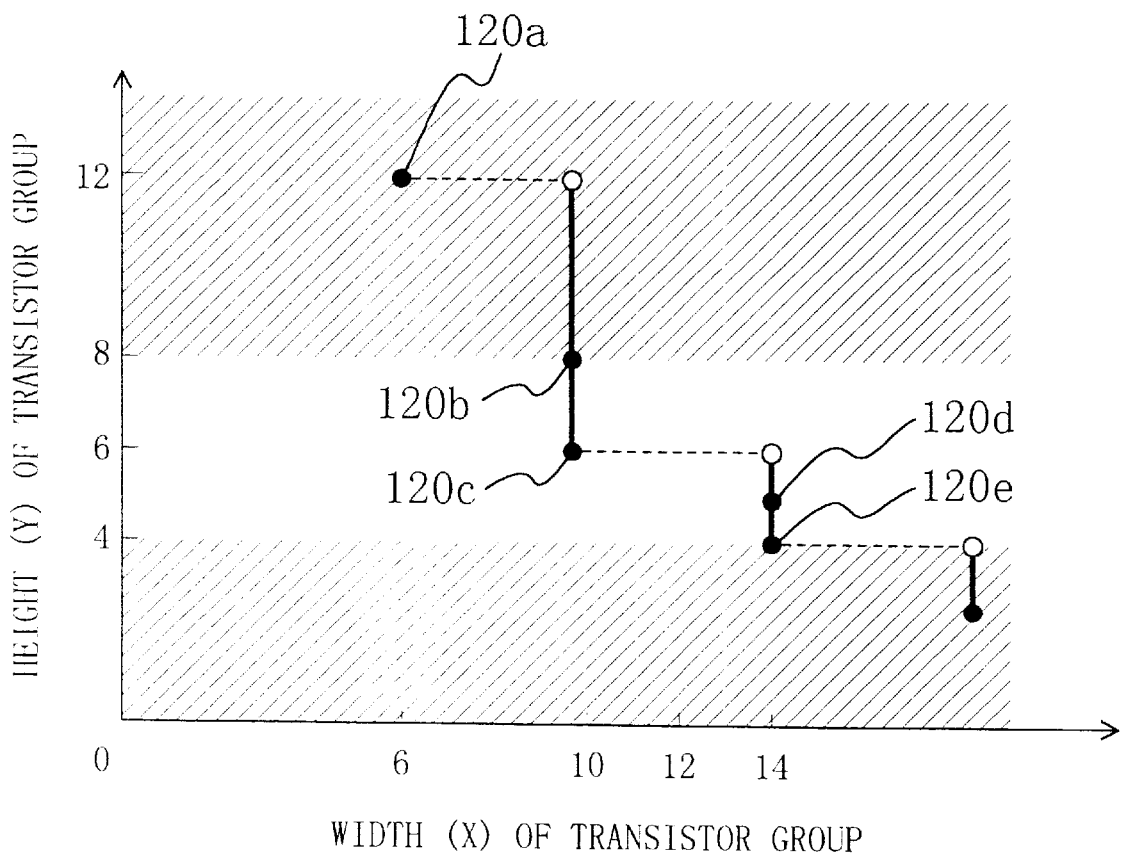
FIG. 11 is a graph showing a geometrical function for the transistor group G1 shown in FIG. 9.

As a result, the geometrical function for the transistor group G1 is represented by a graph shown in FIG. 11, on which the points 120a to 120e correspond to the respective layouts shown in FIGS. 10(a) to 10(e). Due to the constraints on the height of the P-channel region as mentioned above, only a part of the geometrical function in the non-hatched portion can actually be laid out. The geometrical functions of the other transistor groups can be obtained in a similar manner.

By using the geometrical functions thus obtained for the individual transistor groups, it is possible to determine the potential area occupied by the transistors when the heights of the P-channel and N-channel regions are specified. Area allocation to the transistors is performed most efficiently at points at which the widths of the transistors change in each of the geometrical functions. Thus, such points are thoroughly listed as candidates for the heights of the P-channel and N-channel regions.

Since the transistor groups in the P-channel region and the transistor groups in the N-channel region are stacked to form upper and lower layers in the cell, it is required to provide a sufficient space Dd therebetween for a PN isolation region and wiring. For this purpose, a table capable of statistically providing the space Dd based on a wiring net is prepared so that cell height candidates are obtained by adding the space Dd obtained from the table to the candidates for the heights of the P-channel and N-channel regions.

(Step E5) For each cell height candidate, the cell area is estimated by adding areas of the transistors and the wiring area based on an expected wiring length calculated from the number of fan-outs of each net and subtracting from the sum the decrement of area resulting from diffusion sharing by assuming the number of shared diffusion regions to correspond to the number of output, power-source, and ground nets. Thereafter, the estimated cell area is divided by the cell height candidate of concern and the resulting value is defined as the cell width corresponding to the cell height candidate of concern. It is assumed here that the relationship between the number of fan-outs and the wiring length has preliminarily been specified based on a table.

(Step E6) Based on the combination of each cell height candidate and the corresponding cell width obtained in Step E5, the cell geometrical function satisfying the delay requirement set in Step E1 is obtained.

A conventional module synthesizing apparatus is disadvantageous in that, when a cell having an optimum driving ability is selected or in a like situation, a dead area is likely to arise between cells because of the lower geometrical flexibility of the cell. In other words, the conventional module synthesizing apparatus has no other alternative than to select a cell geometry from the geometries prepared in advance owing to lack of the capabilities to implement a desired cell geometry in a short time and estimate the potential cell geometry. This increases the possibility of producing a dead area between cells and prevents the geometry of the layout module from being accurately optimized.

By contrast, since the module synthesizing apparatus according to the present embodiment can obtain the geometrical function for a cell, the geometry of the layout module can be optimized with high accuracy.

Figure 12:
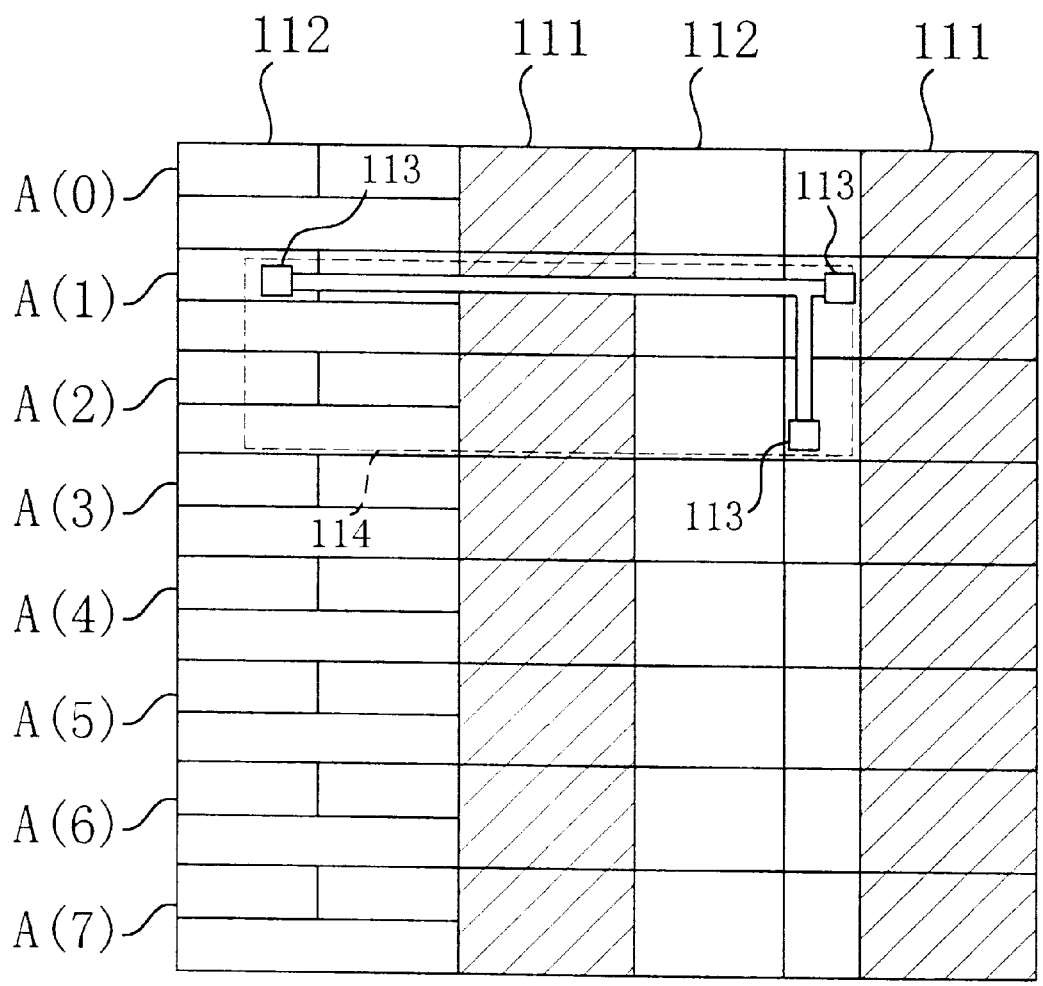
FIG. 12 is a representation illustrating a method of estimating a provisional wiring length.

The function-property estimating unit 31 obtains a delay of a function as follows. First, an intrinsic delay of the function and the output-stage driving ability thereof are read from the logic circuit library 51, and the provisional wiring between functions is also read from the synthesis processing unit 13. It is assumed here that half the perimeter of a square 114 including all terminals 113 associated with the wiring net shown in FIG. 12 corresponds to the provisional wiring length. Subsequently, the length of control wiring such as a carry within the function is estimated based on the distance between cells implementing the same function but corresponding to a different bit. Then, a wiring delay, when the provisional wiring along which data flows between the functions is driven by the output-stage driving ability of the function, is calculated. Finally, the sum of the intrinsic delay of the function, the delay of a signal for controlling the function, and the wiring delay obtained is calculated as the delay of the function of concern.

The function-property estimating unit 31 also obtains power consumption for the function as follows.

The logic circuit library 51 stores a propagation expression for obtaining, for each function, the number of transitions in an output signal based on the number of transitions in input signals and provides the number of transitions in a data signal and a control signal each input to the module which has been obtained by using a test pattern for evaluating power under the conditions on which the whole chip is used. In the case where no such test pattern exists, it is also possible to provide the number of transitions in the data signal input to the module in accordance with a statistical method disclosed, for example, in Japanese Laid-Open Patent Publication No. 8-6980. The function-property estimating unit 31 includes means for inputting the number of transitions in the data signal and control signal input to the module. The conditions under which the module is used are stored in a database, based on which power consumption can be evaluated for each function.

The function-property estimating unit 31 receives from an external system the number of transitions in the data signal and control signal input to the module with respect to the conditions under which the whole chip is used. Next, the process of calculating the number of transitions in the output signal from the module is repeatedly performed by using the propagation expression sequentially defined for the individual functions from the input side of the data path circuit. Next, power consumption is calculated for each function based on a load on each signal line and the number of transitions in the signal. The power consumption calculated for each function is stored in the logic circuit library 51. It is to be noted that the method disclosed in Japanese Laid-Open Patent Publication No. 8-6980 may be used to obtain the foregoing propagation expression from the behavioral description of the function.

Next, the optimization processing unit 35 will be described.

The circuit-clustering processing unit 36 specifies cells by grouping circuit components in a logic circuit diagram such as that shown in FIG. 13. A circuit clustering process performed by the circuit-clustering processing unit 36 will be described with reference to FIG. 13.

Figure 13A:
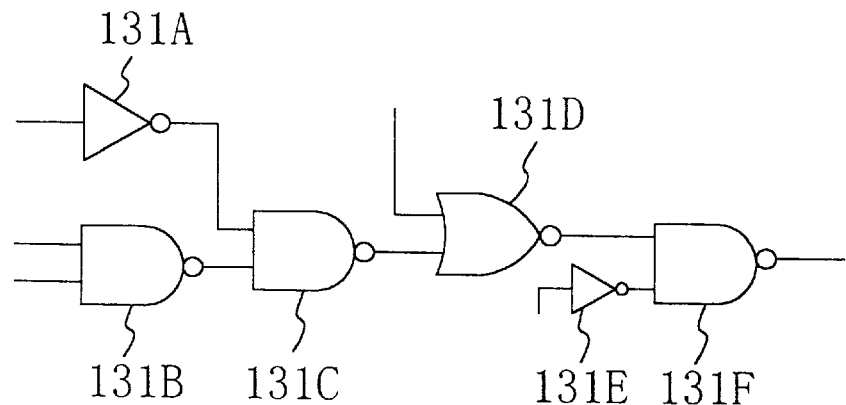
FIGS. 13(a) and 13(b) are diagrams illustrating a method of performing a circuit clustering process.
Figure 13B:
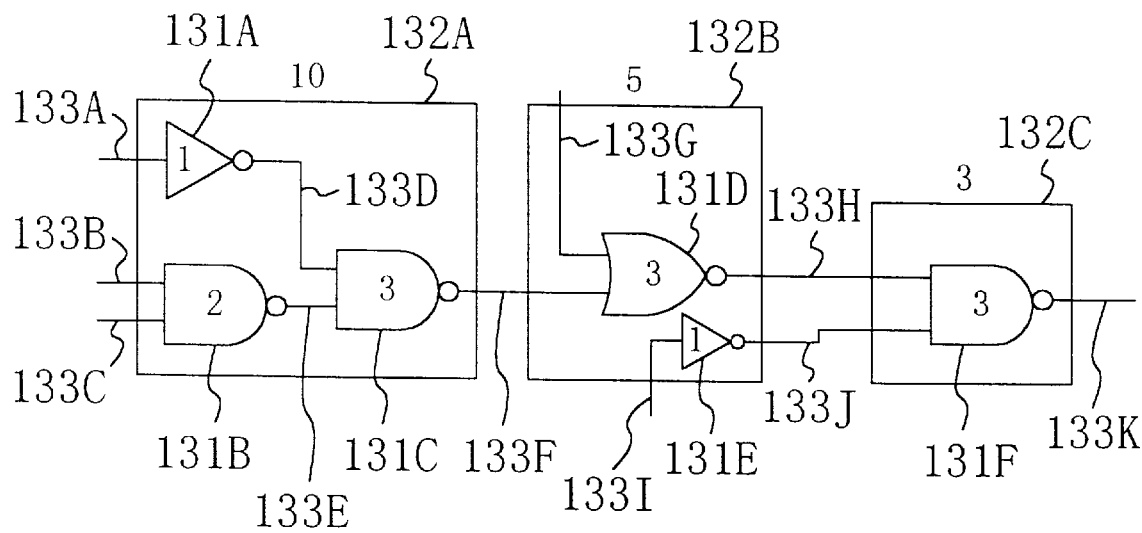

FIG. 13(a) shows a circuit included in a 1-bit netlist. FIG. 13(b) shows an example of the allocation of the components of the circuit shown in FIG. 13(a) to the cells. In FIGS. 13(a) and 13(b), 131A to 131F denote the circuit components, 132A to 132C denote cells to be generated and 133A to 133K denote wires. In FIG. 13(b), numerals representing respective estimated values of area are indicated in the circuit components 131A to 131F, while numerals representing respective limit values to area are indicated over the cells 132A to 132C.

First, a wire on the delay critical path is selected and weighted. Then, an upper limit value is set for the cell in accordance with an externally given instruction. The sets of circuit components allocated to the individual cells are determined by repeatedly interchanging the circuit components between the individual cells such that the sum of the areas occupied by the circuit components Included in each of the cells is equal to or lower than the upper limit value when a diffusion region is shared and that the number of cuts undergone by the weighted wire is minimized. The sum of the areas occupied by the circuit components included in each of the cells is calculated by the cell-property estimating unit 32.

Finally, the circuit components are decisively grouped to be allocated to the cells based on the relationship between the circuit components contained in the netlist initially processed and the corresponding circuit components included in netlists for other bits.

The gate-level-driving-ability optimizing unit 37 repeatedly examines data displayed by the property display unit 20 for a function or cell with slack and replaces a circuit included therein by a circuit having a lower output driving ability and occupying a smaller area, thereby optimizing the output-stage driving ability of each cell.

The transistor-level-driving-ability optimizing unit 38 optimizes the size of each transistor within each cell such that the area occupied by the transistors is minimized when the transistor size in the output stage of the cell and a delay time of the cell are specified. The optimization is implemented by using, for example, a method of optimizing a transistor size disclosed in "TILOS: A Posynomial Programming Approach to Transistor Sizing" (Fishburn et. al, ICCADD85, pp. 326–328, 1985).

The in-module-wiring processing unit 39 installs wiring between the cells, which is implemented by using, for example, a method disclosed in "General Models and Algorithms for Over-the-cell Routing in Standard Cell Design" (J. Cong, B. Preas and C. L. Lin, Proc. of DAC, pp. 709–715, June 1990).

Figure 14:
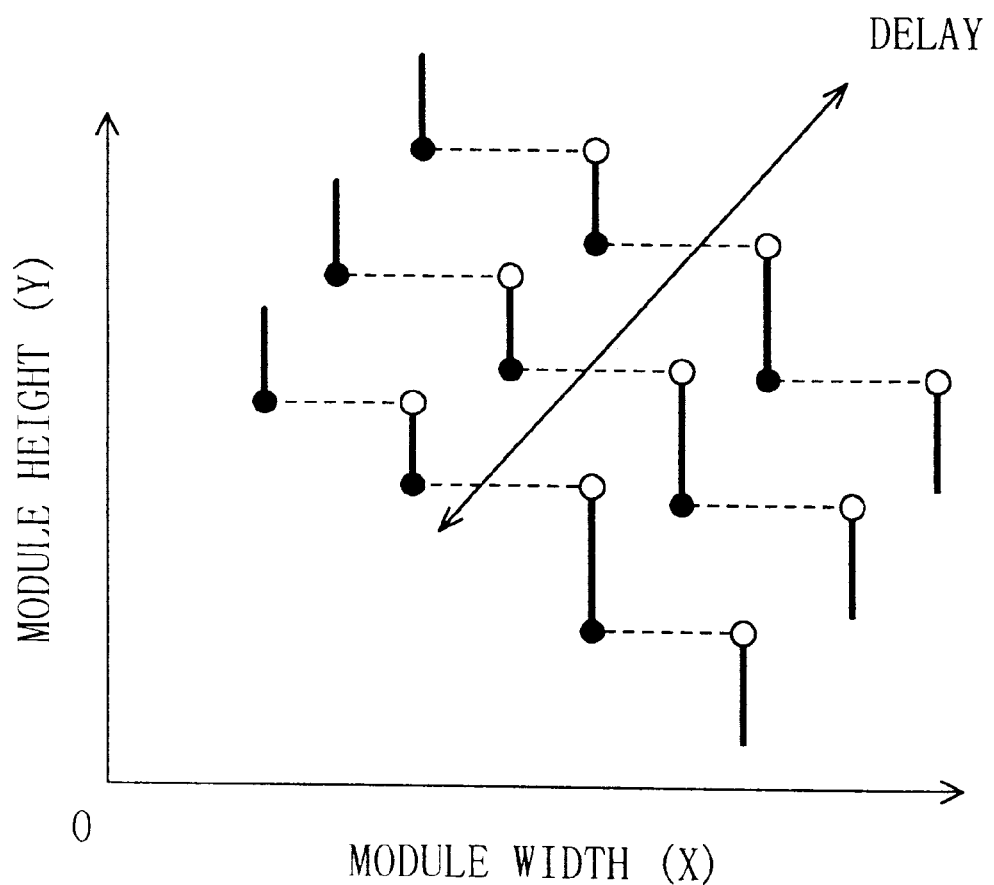
FIG. 14 is a graph showing an example of a geometrical function parameterized by delay for a layout module.

The synthesis processing unit 13 outputs, as the module estimation data, the layout module 3 which is a result of synthesizing the module and the geometrical function 4 parameterized by delay for the module. FIG. 14 is a graph showing an example of the geometrical function 4 parameterized by delay for the module.

Figure 15:
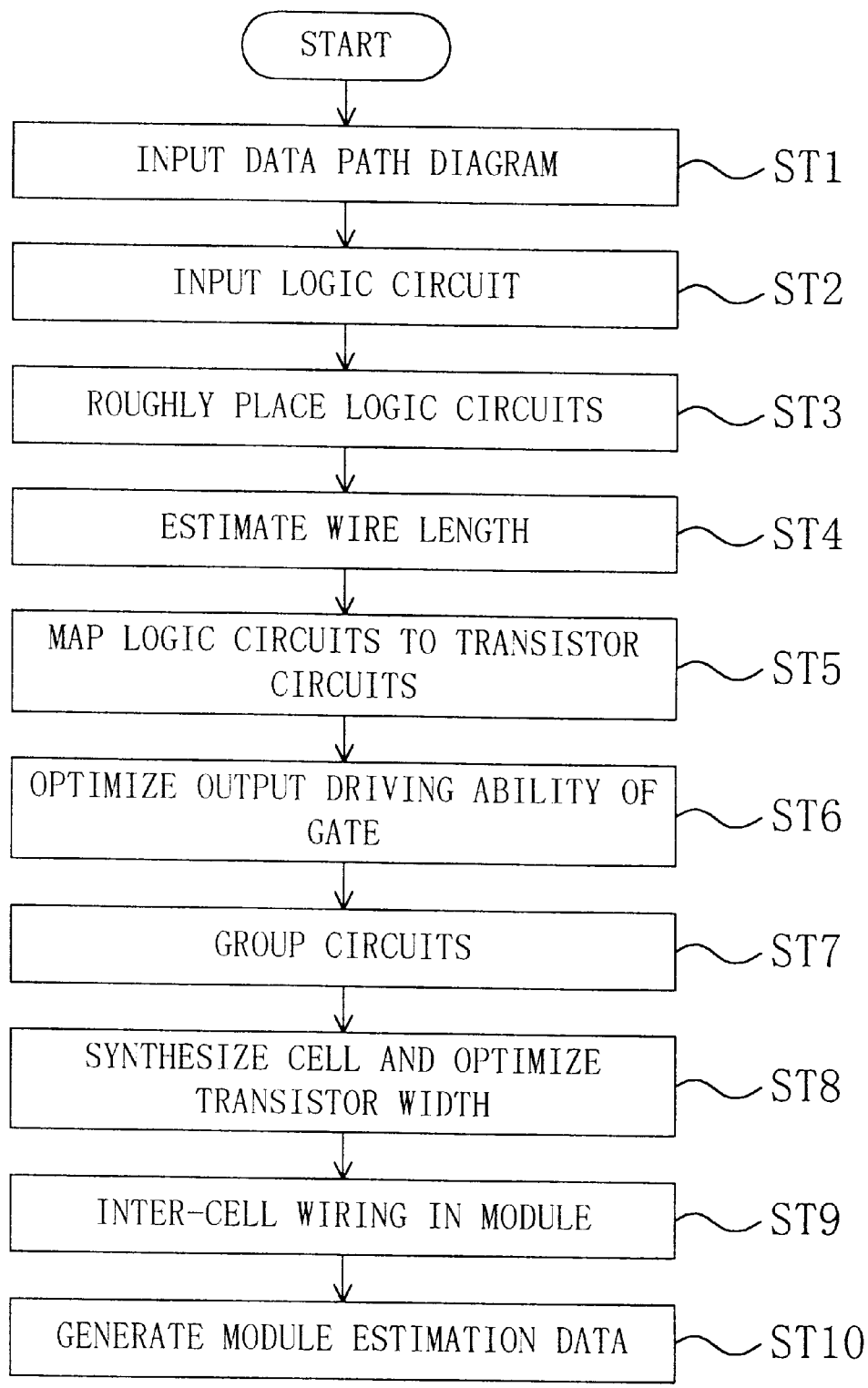
FIG. 15 is a flow chart showing the flow of a module synthesizing process according to the embodiment.

The module synthesizing process performed by the module synthesizing apparatus shown In FIG. 1 will be described. FIG. 15 is a flow chart showing the flow of the module synthesizing process performed by the module synthesizing apparatus shown in FIG. 1.

First, in Step ST1, a data path diagram 1 is input to the functional-level processing unit 11 such that the arrangement of registers In the data path diagram 1 is corrected based on an instruction given to th e data-path-diagram display correcting unit 11a by a user monitoring the delay and other properties of each function displayed on the screen by the function-property display unit 21 or automatically by the functional-level processing unit 11 based on an evaluation index for delay optimization.

Next, In Step 6T2, the functional-level processing unit 11 reads, for each function, the corresponding logic circuit from the logic circuit library 51 and allocates it to the function in the data path diagram Input in Step ST1 and having a corrected arrangement of registers, thereby generating logic circuit data 2 and input the data to the logic-level processing unit 12. The logic circuit data 2 here in represents only the logic of the circuit and does not represent the transistor circuit corresponding to the logic. The logic circuit data 2 may also be externally input directly via some input means 62 such as a scheme editor. Briefly, the module synthesizing apparatus according to the present embodiment may receive either the data path diagram 1 represented on an abstract level or the logic circuit data 2 represented on a logic level.

Next, in Step ST3, the logic circuit input in Step ST2 is roughly placed on a block.

Next, in Step ST4, the provisional wiring length between the logic circuits is obtained based on the rough arrangement obtained in Step ST3.

Next, in Step ST5, a transistor circuit corresponding to each logic circuit is read from the transistor circuit library 52 and allocated thereto. The transistor circuit library 52 has several candidate transistor circuits prepared for each logic circuit. Thus, by selecting an optimum candidate from these candidates based on the expected number of fan-outs and an expected delay time, the logic circuit is allocated to the transistor circuit.

Next, in Step ST6, the gate-level-driving-ability optimizing unit 35 optimizes the driving ability of the output-stage gate of each logic circuit based on the provisional. wiring length between the logic circuits, delay objectives, and delay constraints.

Next, in Step ST7, clustering of the circuits is performed. In this step, the circuits are grouped based on an instruction given by a user to the logic-circuit-diagram display correcting unit 12a or by an automatic process performed by the circuit-clustering processing unit 36, whereby cells are specified.

Next, in Step ST8, the transistor-level-driving-ability optimizing unit 38 performs for each cell specified in Step ST7, optimization of the in-cell driving ability and layout synthesis in order to minimize in-cell delay and area.

Next, in Step ST9, wiring is performed between the cells by the in-module-wiring processing unit 39.

Finally, in Step ST10, the module estimation data is generated.

Step ST10 will be described in greater detail. Herein, the cells are assumed to be arranged in a slicing structure and the floorplan for the module is assumed to have externally been given to the synthesis processing unit 13.

First, one clock period is externally set. Next, the output-stage driving ability of each cell located between registers and an in-cell delay requirement for the cell are determined such that data can be transferred between the registers within the set clock period. Based on the output-stage driving ability and in-cell delay requirement of each cell, the cell-property estimating unit 32 obtains, for each cell, the geometrical function parameterized by delay.

Next, a plurality of delay requirements are set for the module so that the geometrical functions for the module are obtained by performing Estimation of Module Geometrical Function as follows with respect to each of the delay requirements.

Estimation of Module Geometrical Function (Step F1) A delay requirement for each cell is determined so as to satisfy the set delay requirements and minimize a module area. The process performed in Step F1 will be described later.

(Step F2) For each cell constituting the module, one geometrical function is determined in response to the delay requirement determined in Step F1 by referencing the geometrical function parameterized by delay which has already been obtained by the cell-property estimating unit 32.

(Step F3) The geometrical function for the module is obtained based on the geometrical function for each cell determined in Step F2 and on the floorplan for the module.

Figure 16A:
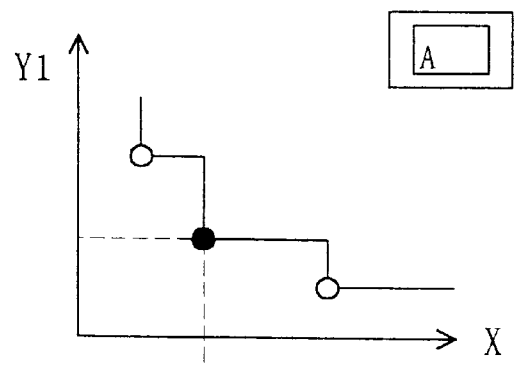
FIGS. 16(a) to 16(c) illustrate a method of obtaining a module geometrical function.
Figure 16B:
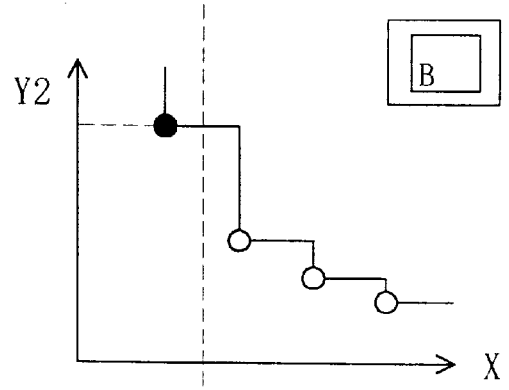
Figure 16C:
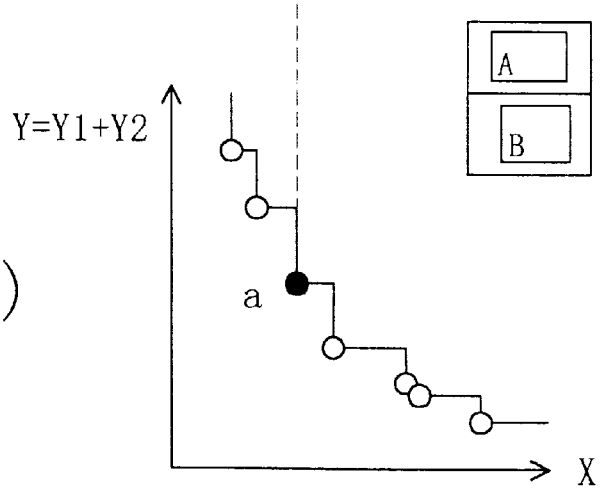

The process performed in Step F3 (disclosed in "Optimal Orientations of Cells in Slicing Floorplan Designs" L. Stockmayer, Information and Control, Vol. 59, pp. 91–101, 1983) will be described with reference to FIG. 16. FIG. 16(a) shows the geometrical function for Cell A, FIG. 16(b) shows the geometrical function for Cell B, and FIG. 16(c) shows the geometrical function for the rectangle enclosing Cells A and B vertically adjacent to each other. The geometrical function shown In FIG. 16(c) Is obtained by adding, In the Y direction, the geometrical functions shown in FIGS. 16(a) and FIG. 16(b). Briefly, the geometrical function for the rectangle enclosing the cells vertically adjacent to each other can be obtained by adding, in the Y direction, the geometrical functions for the respective cells vertically adjacent to each other. Likewise, the geometrical function for the rectangle enclosing cells horizontally adjacent to each other can be obtained by adding, in the X direction, the geometrical functions for the respective cells. Thus, the geometrical function for the whole module can be obtained by adding, in each of the X and Y directions, the geometrical functions for the respective cells based on the positional relationship between the adjacent cells represented in the slicing structure. The geometrical function for the module is obtained by adding the area corresponding to the wiring between the cells to the obtained geometrical function for the whole module.

The process performed in Step F1 will be described in greater detail. In Step F1, an objective function for determining the delay requirement for each cell is given by the following equation (1):

$$\text{Objective Function} = (\text{Module Area})^*p \quad (1)$$

where p is a penalty constant, which is 1 or 2 depending on whether the module satisfies the delay requirement or not.

The delay requirement for each cell is determined by a successive improvement method such that the value given by the objective function (1) is minimized. Specifically, an initial value is given as a delay of each cell. By varying the delay in each cell (the quantity of variation is determined appropriately based on the cell geometrical function parameterized by delay which has already been obtained by the cell-property estimating unit 32), the objective function is obtained so that the delay of each cell which minimizes the objective function is determined as the delay requirement.

It is assumed that the module area in the objective function given by the equation (1) is determined by the minimum area in the module geometrical function. The module geometrical function is obtained from the cell geometrical functions determined by delay for the individual cells and from the floorplan for the module, similarly to Step F3.

Whether the module satisfies the delay requirement or not is determined by estimating the delay of the module and comparing the delay of the module with the delay requirement.

The delay of the module is defined by a maximum or mean value of a delay on each path from the input terminal of the module to the output terminal thereof. The delay on the path is obtained by adding up the delays of the individual cells constituting the path and a wiring delay estimated on the basis of wiring load from the module geometrical function and from the floorplan.

A supplementary description will be given to the procedure of synthesizing the module according to the present embodiment.

The data path diagram as shown in FIG. 2 is representation of data flowing through the functions before the insertion position of a register and the insertion position of a wire have not been determined. Scheduling for a pipeline or the like can be defined as the matter of determining the insertion position of the register to define a path between the registers and establishing the order in which arithmetic. operations are performed on the path between the registers.

Optimization of the module on the level of the data path diagram can be performed through: (1) optimization of the insertion position of a register; (2) optimization of timing for a circuit between the registers; and (3) optimization of an internal delay in the circuit between the registers.

As for (1), scheduling data can be reflected in module synthesis by a user giving an instruction on the insertion position of a resister for pipeline processing, since the module synthesizing apparatus according to the present embodiment includes the data-path-diagram display correcting unit 11a having the capabilities of displaying the data path diagram and correcting the insertion position of a register based on an externally given instruction.

As for (2), the timing can be optimized by repeating the process of finding out the circuit between the registers that will serve as the critical path for the whole circuit and constantly increasing the driving ability of the circuit associated with the critical path. The logic circuit corresponding to each function can be obtained by referencing the logic circuit library 51.

As for (3), the area and delay time can be optimized by generating a transistor circuit corresponding to each function and changing the setting of the gate width of each transistor in the generated transistor circuit. In the present embodiment, the logic circuit library 51 has instance data represented by using the area and delay time as parameters and an internal delay in the circuit located between the registers can be set at a desired value by optimizing the parameters. The instance data stored in the logic circuit library 51 is generated by the cell-property estimating unit 32.

Thus, since the present invention can synthesize a layout module for a data path circuit based on a cell geometrical function parameterized by delay, a dead area between cells can be reduced and the geometry of the layout module can be optimized more accurately as compared with a conventional apparatus.

Moreover, a linkage to the upper process of design is established more easily as compared with a conventional apparatus, since the geometrical function parameterized by delay for the layout module is generated by using the cell geometrical function parameterized by delay.

Furthermore, a module superior in delay performance to that of a conventional apparatus can be synthesized, since the imbalanced processing times between the individual time slots in the data path diagram can be corrected easily.

What is claimed is:

1. A module synthesizing apparatus for synthesizing a layout module for a data path circuit, comprising:
    a logic-level processing unit for specifying cells in said data path circuit based on logic circuit data representing said data path circuit on a logic level;
    a cell-property estimating unit for obtaining a geometrical function parameterized by delay for a cell provided with a circuit configuration on a transistor level; and
    a synthesis processing unit for setting circuit configurations on the transistor level for the respective cells specified by said logic-level processing unit, supplying the set circuit configurations on the transistor level to said cell-property estimating unit, and then synthesizing a layout module based on geometrical functions of the respective cells to minimize a dead area between the cells, which have been parameterized by delays and have been obtained by said cell-property estimating unit.

2. The module synthesizing apparatus of claim 1, wherein said synthesis processing unit synthesizes the layout module and/or obtains a geometrical function of the layout module parameterized by delay.

3. The module synthesizing apparatus of claim 1, further comprising
    a functional-level processing unit for converting a data path diagram into the logic circuit data by allocating a logic circuit to each function,
    said logic-level processing unit receiving the logic circuit data obtained by said functional-level processing unit.

4. The module synthesizing apparatus of claim 1, wherein said logic-level processing unit comprises a logic-circuit-diagram display correcting unit for displaying said logic circuit data and for correcting an extent of each of the cells In the data path circuit, which extent is represented by the displayed logic circuit data, based on an Instruction given from the outside of said module synthesizing apparatus.

5. The module synthesizing apparatus of claim 1, wherein said cell-property estimating unit comprises:

means for obtaining a gate width of each transistor based on the circuit configuration of each said cell on the transistor level such that a delay requirement for each said cell is satisfied;

means for classifying transistors, constituting each said cell, into a plurality of transistor groups such that serially connected transistors share a diffusion region;

means for obtaining, for each said transistor group, a geometrical function representing a geometry of each said transistor group varying In accordance with how the transistors belonging to each said transistor group are folded and for obtaining cell height candidates based on a height candidate of each said transistor group obtained based on the geometrical function; and means for estimating, for each said cell height candidate, a cell area by subtracting a decrement of area resulting from diffusion sharing from a sum of areas of the transistors belonging to each said cell and a wiring area obtained based on an expected wiring length and for calculating a cell width corresponding to each said cell height candidate by dividing the estimated cell area by each said cell height candidate, said cell-property estimating unit obtaining the geometrical function of each said cell based on a combination of each said cell height candidate and the cell width corresponding to each said cell height so as to satisfy the delay requirement.

6. A module synthesizing method for synthesizing a layout module for a data path circuit, comprising the steps of:

converting a data path diagram into logic circuit data representing the data path circuit on a logic level by allocating a logic circuit to each function;

specifying cells in said data path circuit based on said logic circuit data;

obtaining a geometrical function parameterized by delay for each of the specified cells; and synthesizing a layout module based on a floorplan for the layout module and the geometrical functions of the cells that have been parameterized by delays to minimize a dead area between the cells.

7. The module synthesizing method of claim 6, further comprising a step of synthesizing the layout module and/or obtaining a geometrical function parameterized by delay for the layout module.

* * * * *